(12) United States Patent
Huang et al.

(10) Patent No.: US 8,932,010 B2
(45) Date of Patent: Jan. 13, 2015

(54) CENTRIFUGAL FAN MODULE, HEAT DISSIPATION DEVICE HAVING THE SAME AND ELECTRIC DEVICE HAVING THE HEAT DISSIPATION DEVICE

(75) Inventors: Yu-Nien Huang, Taoyuan County (TW); Ching-Chin Chen, New Taipei (TW); Chun-Fa Tseng, Kaohsiung (TW); Chun-Che Chiu, New Taipei (TW); Hsin-Yu Wang, Kaohsiung (TW); Sung-Fong Yang, Taipei (TW)

(73) Assignee: Quanta Computer Inc., Taoyuan Shien (TW)

( * ) Notice: Subject to any disclaimer, the term of this patent is extended or adjusted under 35 U.S.C. 154(b) by 515 days.

(21) Appl. No.: 13/346,753

(22) Filed: Jan. 10, 2012

(65) Prior Publication Data

US 2013/0039752 A1    Feb. 14, 2013

(30) Foreign Application Priority Data

Aug. 9, 2011    (TW) .............................. 100128383 A

(51) Int. Cl.
*F04D 29/42* (2006.01)
*H01L 23/467* (2006.01)
*G06F 1/20* (2006.01)

(52) U.S. Cl.
CPC .............. *H01L 23/467* (2013.01); *G06F 1/203* (2013.01); *F04D 29/4246* (2013.01)
USPC .......................................... 415/178; 415/206

(58) Field of Classification Search
CPC .. F04D 29/4213; F04D 29/424; F04D 29/426
USPC .......................................... 415/102, 178, 206
See application file for complete search history.

(56) References Cited

U.S. PATENT DOCUMENTS

| 6,650,540 | B2 * | 11/2003 | Ishikawa ........................ 361/695 |
| 7,044,720 | B1 * | 5/2006  | Yamamoto et al. ......... 417/423.1 |
| 7,486,519 | B2 * | 2/2009  | Loiler et al. .................. 361/720 |
| 7,740,054 | B2 * | 6/2010  | Yang ........................ 165/104.33 |

FOREIGN PATENT DOCUMENTS

| JP | 2005-321287 | 11/2005 |
| JP | 2009-239118 | 10/2009 |
| JP | 2010-086053 |  4/2010 |

\* cited by examiner

*Primary Examiner* — Ninh H Nguyen
(74) *Attorney, Agent, or Firm* — Rabin & Berdo, P.C.

(57) ABSTRACT

A centrifugal fan module, a heat dissipation device having the same and an electric device having the heat dissipation device are provided, in which the heat dissipation device includes a fin module and a centrifugal fan module including a volute-shaped frame and a centrifugal fan pivoted in the volute-shaped frame. The volute-shaped frame includes an air inlet, a larger air outlet and a smaller air outlet. The air inlet and the smaller air outlet are both on the same surface of the volute-shaped frame. The larger air outlet is coupled to the fin module. The smaller air outlet is arranged correspondingly to a maximum wind-speed flowing path of the centrifugal fan.

10 Claims, 6 Drawing Sheets

CENTRIFUGAL FAN MODULE, HEAT DISSIPATION DEVICE HAVING THE SAME AND ELECTRIC DEVICE HAVING THE HEAT DISSIPATION DEVICE

RELATED APPLICATIONS

This application claims priority to Taiwanese Application Serial Number 100128383, filed Aug. 9, 2011, which is herein incorporated by reference.

BACKGROUND

1. Technical Field

The present invention relates to a centrifugal fan module, more particular to a centrifugal fan module for improving high temperature problem.

2. Description of Related Art

At present, with the needs of portable computers, a notebook computer does not have enough internal space in a chassis thereof for natural heat convection anymore. Especially, the thermal design for high-frequency components (e.g. central processing unit, CPU and graphic processing unit, GPU) in the notebook computer has recently been stuck at this step. Therefore, a method of using a centrifugal fan for producing forced heat convention has been a common manner adopted in the notebook computers.

Even through using the centrifugal fan for producing forced heat convention can improve the performance of heat exchange, it is still difficult to meet increasingly strict standards of notebook computers. These standards not only regulate on chip performances in notebook computers, but also on noise and temperature of back plate of the notebook computers. Thus, the heat-sink apparatus including centrifugal fan still needs to improve in development and research by vendors.

Specifically, the heat radiating technology of the notebook computers mostly adopts a remote heat exchanger (RHE). The remote heat exchanger (RHE) is to configure a radiating fin at an outlet of a centrifugal fan, and collect heat from the mentioned high-frequency components by a heat pipe. The advantage of the remote heat exchanger (RHE) is that the position of the radiating fin and the centrifugal fan can be nothing to do with the position of the mentioned high-frequency components.

However, after airflows outputted from the outlet of the centrifugal fan to bring heat from the radiating fin to form hot air, the hot air can be possibly sucked back into the centrifugal fan. At this moment, since the radiating fin still remains high temperature, due to natural heat convection and thermal radiation, the hot air back into the radiating fin can be guided towards the chassis surfaces upward and downward the radiating fin, so as to generate overheat problem on the chassis surfaces.

SUMMARY

The present invention is to provide a centrifugal fan module, a heat dissipation device having the centrifugal fan module, and an electric device having the heat dissipation device, which is capable of blocking heat air to flow back into the centrifugal fan module after the heat air passes through the radiating fin, so as to enhance the heat dissipation performance of the centrifugal fan module, and solve the overheat problem on the chassis surfaces above and below the radiating fin.

The present invention is to provide a centrifugal fan module, a heat dissipation device having the centrifugal fan module, and an electric device having the heat dissipation device, which is capable of releasing overpressure in the centrifugal fan module so as to decrease high-frequency noise of the centrifugal fan module.

The heat dissipation device of the invention comprises a heat dissipation fin module and a centrifugal fan module. The centrifugal fan module comprises a volute-shaped frame, a centrifugal fan and a motor. The volute-shaped frame comprises an air inlet, a larger air outlet and at least one smaller air outlet. The air inlet is formed on a surface of the volute-shaped frame. The larger air outlet is arranged to be a volute opening of the volute-shaped frame, and connected to the heat dissipation fin module. The smaller air outlet is formed on the surface of the volute-shaped frame closer to the heat dissipation fin module than the air inlet. The centrifugal fan is pivotally disposed in the centrifugal fan module, and rotates according to a clockwise direction. The centrifugal fan inhales air through the air inlet, and blows air from the larger air outlet and the smaller air outlet together. The motor drives the centrifugal fan to rotate. The smaller air outlet is further located on the surface of the volute-shaped frame corresponding to a maximum wind-speed flowing path of the centrifugal fan to the larger air outlet.

In the embodiments, the smaller air outlet can be presented as a trapezoidal, a circular sector or a triangle shape.

In another embodiment, the smaller air outlet comprises a first side and a second side opposite with each other. The first side thereof is closer to the heat dissipation fin module than the second side thereof, and the first side thereof is longer than the second side thereof.

In further another embodiment, two of the smaller air outlets are symmetrically arranged on two opposite surfaces of the volute-shaped frame.

In other embodiment, the maximum wind-speed flowing path of the centrifugal fan is an air flowing direction of the air which is perpendicular to a longitudinal side of the heat dissipation fin module, after the air is blown apart from the rotating centrifugal fan.

Also, the heat dissipation device further comprises a wind-resisted wall. The wind-resisted wall is disposed on the surface of the volute-shaped frame, and is arranged between the air inlet and the smaller air outlet, and between the air inlet and the heat dissipation fin module.

In the embodiment of the present invention, the notebook computer comprises a chassis and the aforementioned heat dissipation device. The heat dissipation device is installed inside the chassis.

Furthermore, the centrifugal fan module comprises a centrifugal fan and a volute-shaped frame. The volute-shaped frame containing the centrifugal fan therein, and the volute-shaped frame comprises two opposite surfaces, two air inlets, and a larger air outlet. The air inlets are respectively formed on the two opposite surfaces of the volute-shaped frame, for providing air inhaled into the centrifugal fan. The larger air outlet is arranged to be a volute opening of the volute-shaped frame between the two opposite surfaces, for outputting most part of the air from the centrifugal fan. The trapezoidal air outlets are respectively formed on the opposite surfaces of the volute-shaped frame and corresponding to a maximum wind-speed flowing path of the centrifugal fan to the larger air outlet, for outputting a smaller part of the air from the centrifugal fan.

BRIEF DESCRIPTION OF THE DRAWINGS

The present invention will be apparent to those skilled in the art by reading the following detailed description of a preferred embodiment thereof, with reference to the attached drawings, in which.

DESCRIPTION OF THE PREFERRED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

As foregoing mentioned above, the present invention provides a centrifugal fan module, a heat dissipation device having the same and an electric device having the heat dissipation device, in which by improving the structure of the prior art, the improved centrifugal fan module further provides another separated outputted airflow other than the main airflow to the radiating fin, and the improved centrifugal fan module accelerates the separated outputted airflow for blocking heat air from the radiating fin to flow back into the centrifugal fan module, and enhancing the heat dissipation performance of the centrifugal fan module and the entire effectiveness of heat dissipation of the heat dissipation device, so as to solve the overheat problem on the chassis surfaces above and below the radiating fin.

Figure 1:
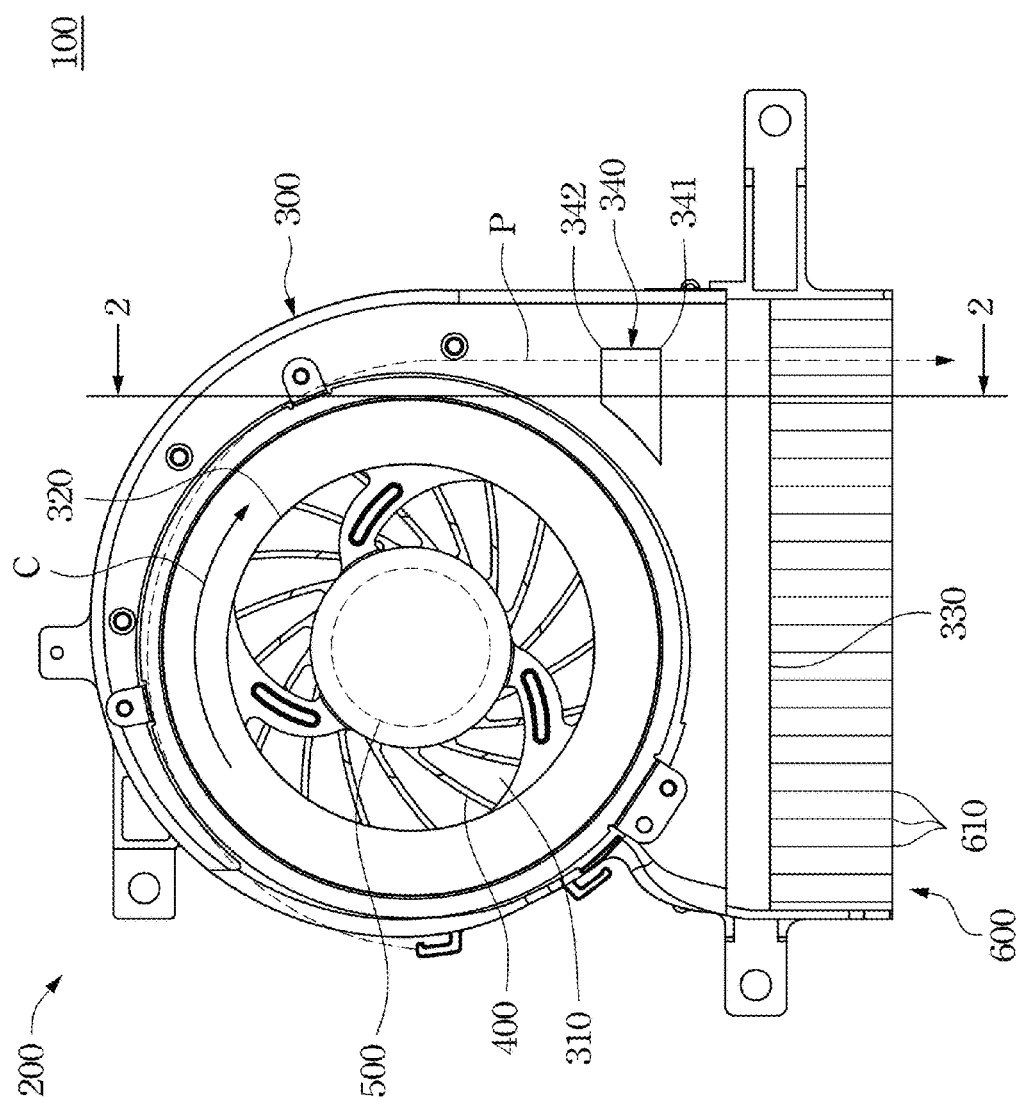
FIG. 1 is a top view of a heat dissipation device according to an embodiment of the present invention.
Figure 2:
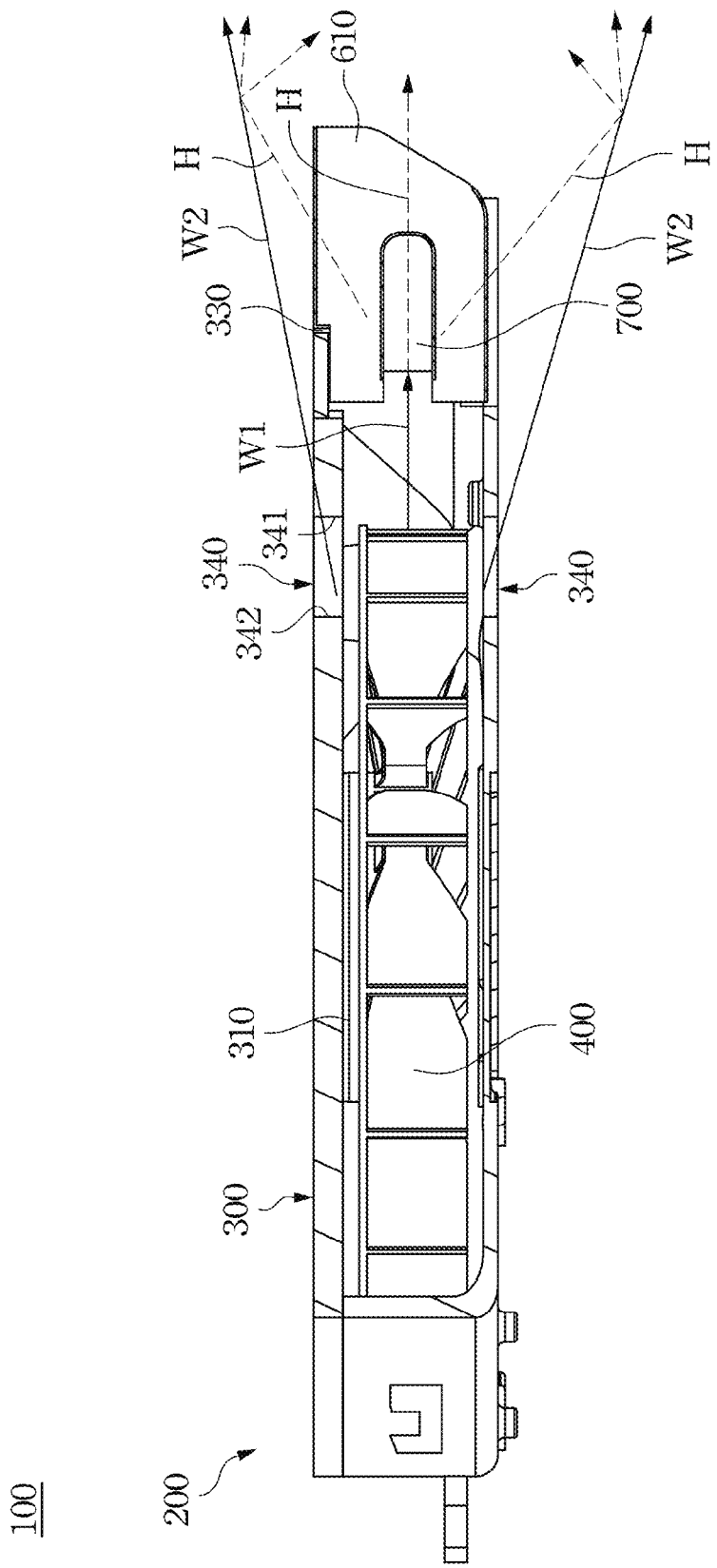
FIG. 2 is a cross-sectional view taken alone line 2-2 of FIG. 1 and a movement diagram of airflows.

Refer to FIG. 1 and FIG. 2, FIG. 1 is a top view of a heat dissipation device 100 according to an embodiment of the present invention; and FIG. 2 is a cross-sectional view taken alone line 2-2 of FIG. 1 and a movement diagram of airflows.

The heat dissipation device 100 mainly comprises a heat dissipation fin module 600, a centrifugal fan module 200 and a heat pipe 700 (FIG. 2). The heat dissipation fin module 600 includes a plurality of heat dissipation fins 610 arranged spaced for increasing heat dissipation surface areas. One end of the heat pipe 700 physically contacts to one or more heat dissipation objects (e.g. central processing unit, graphic processing unit or/and communication processing unit, not shown in figures), the other end of the heat pipe 700 physically contacts with the heat dissipation fin module 600.

Thus, heat generated from the heat dissipation objects can be passed to the heat dissipation fin module 600 through the heat pipe 700 with good thermal conductivity. In a specific embodiment, the other end of the heat pipe 700 which is physically contacted to the heat dissipation fin module 600, for example, can be penetrated through each heat dissipation fin 610 or soldered on an outer side of each heat dissipation fin 610, however, the aforesaid examples shall not be seen as limitations to the scope of the present invention.

The centrifugal fan module 200 comprises a volute-shaped frame 300, a centrifugal fan 400 and a motor 500. The volute-shaped frame 300 has a chamber 310 disposed therein, and the volute-shaped frame 300 has two air inlets 320, two smaller air outlets 340 and a larger air outlet 330 which are arranged on surfaces of the volute-shaped frame 300. In the embodiment, the air inlets 320 are respectively formed on two opposite surfaces of the volute-shaped frame 300. The larger air outlet 330 is arranged between the two opposite surfaces of the volute-shaped frame 300, and designed to be a volute opening of the volute-shaped frame 300 for being a main air vent, in which a cross-sectional area of the larger air outlet 330 is larger than a cross-sectional area of each smaller air outlet 340. Also, the larger air outlet 330 is connected to the heat dissipation fin module 600, and is communicated with the heat dissipation fin module 600. Specifically, the heat dissipation fin module 600 matches and covers the larger air outlet 330, however, the aforesaid examples shall not be seen as limitations to the scope of the present invention.

The centrifugal fan 400 is pivotally disposed in the chamber 310 of the volute-shaped frame 300, and exactly faces to both the air inlets 320 therebetween. While the centrifugal fan 400 is working, the centrifugal fan 400 rotates according to a clockwise direction C. After the centrifugal fan 400 inhales air through the air inlets 320, the rotating centrifugal fan 400 blows the air towards the heat dissipation fin module 600, and when the air is outputted outwards the volute-shaped frame 300, the air can be divided into a larger part of cold airflow W1 and two small parts of cold airflows W2 together via the larger air outlet 330 (i.e. volute opening) and the smaller air outlets 340, respectively. The motor 500 is installed in the volute-shaped frame 300, and pivotally connects the centrifugal fan 400 for driving the centrifugal fan 400 to rotate.

When the rotating centrifugal fan 400 blows air towards the heat dissipation fin module 600, one of the flow paths is a maximum wind-speed flowing path P, as shown in FIG. 1. The maximum wind-speed flowing path P of the centrifugal fan 400 is defined as an airflow direction of the outputted air which is perpendicular to a longitudinal side (or a longitudinal axle) of the heat dissipation fin module 600 (or the larger air outlet 330), after the air is outputted from the rotating centrifugal fan 400.

The smaller air outlets 340 are symmetrically arranged on the opposite surfaces of the volute-shaped frame 300, respectively, and each smaller air outlet 340 is coplanar to one of the air inlets 320. Comparing to the air inlets 320 on the same surface, each smaller air outlets 340 is closer to the heat dissipation fin module 600, and each smaller air outlet 340 is further located on the surface of the volute-shaped frame 600 corresponding to the maximum wind-speed flowing path P of the centrifugal fan 400 to the larger air outlet 330, however, the aforesaid examples shall not be seen as limitations to the scope of the present invention. In other embodiment, the volute-shaped frame 300 also can only have a single air inlet 320 and a single smaller air outlet 340.

Furthermore, each smaller air outlet 340 can be presented as a trapezoidal shape (including vertical trapezoidal shape or isosceles trapezoidal shape), a circular sector shape, or a triangle shape etc.

By illustrating the smaller air outlet 340 with trapezoidal shape as one of the examples in the embodiment of the present invention, the trapezoidal-shaped air outlet 340 (i.e. smaller air outlet) comprises a first side 341 and a second side 342 which are opposite with each other and arranged in parallel. The first side 341 is closer to the heat dissipation fin module 600 than the second side 342, namely, the second side 342 is farer to the heat dissipation fin module 600 than the first side 341.

Therefore, when the motor 500 drives the centrifugal fan 400 to rotate, the rotating centrifugal fan 400 outputs the cold airflow W1 to the heat dissipation fin module 600, and the cold airflow W1 delivers heat on the heat dissipation fins 610 away to become hot air H. At the moment, some of the hot air H might leave the heat dissipation fin module 600, other hot air H might stay around in the heat dissipation fin module 600. At the same time, the cold airflows W2 are respectively outputted from the centrifugal fan 400 through the smaller air outlets 340 disposed above/below the surfaces of the volute-shaped frame 300, thus, since the cold airflows W2 are both outputted outwards the volute-shaped frame 300 towards a same direction above/below the surfaces of the volute-shaped frame 300, the cold airflows W2 can mix with the hot air H for cooling down the high temperature of the hot air H.

Figure 3:
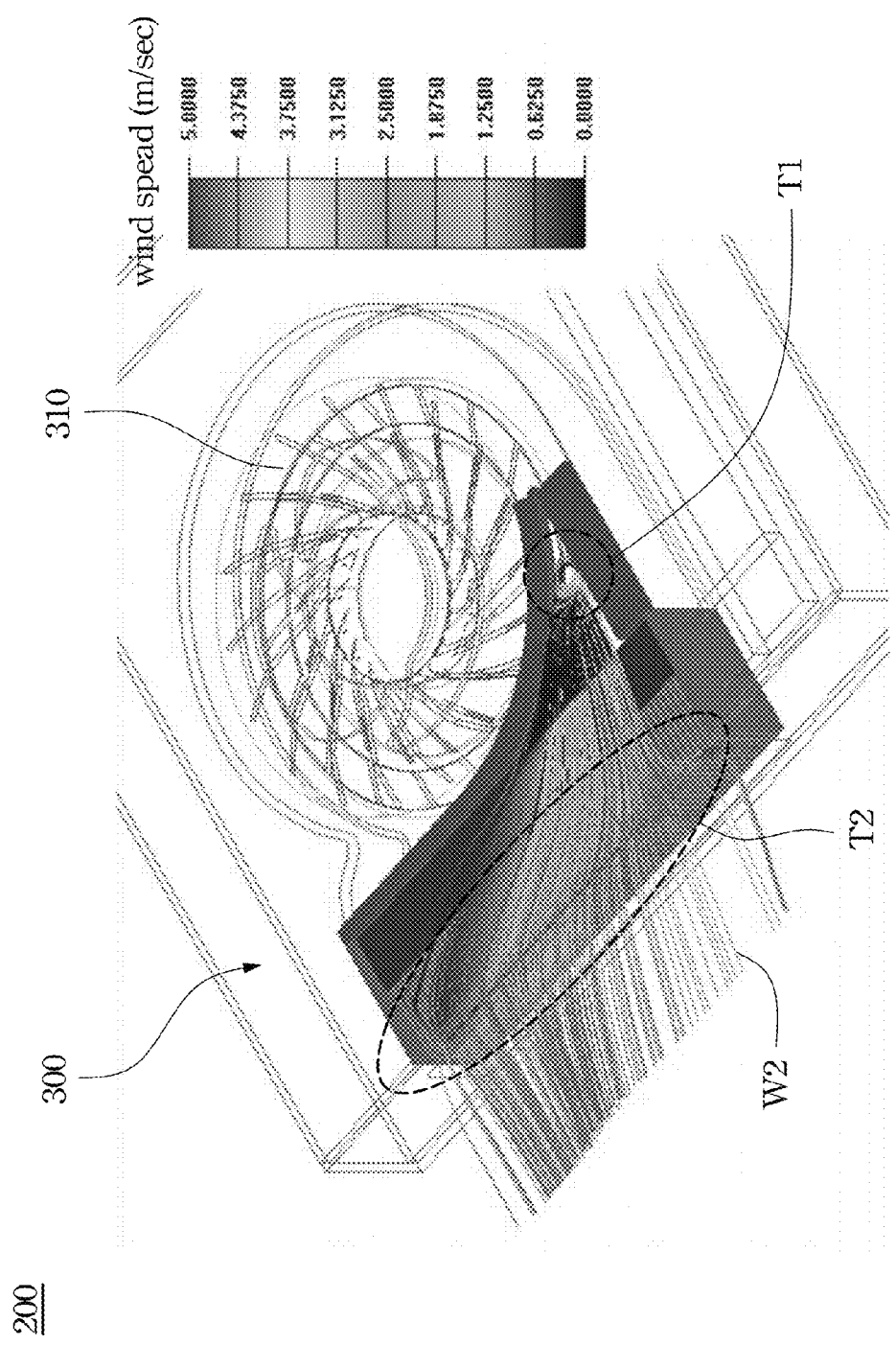
FIG. 3 is a simulation result diagram of airflow speed of air outputted from a trapezoidal opening of the heat dissipation device of the present invention.

Furthermore, please refer to FIG. 1 and FIG. 3, in which FIG. 3 is a simulation result diagram of airflow speed of air outputted from a trapezoidal opening 340 of the heat dissipation device 100 of the present invention.

Since each trapezoidal-shaped air outlet 340 (i.e. smaller air outlet) of the embodiment is presented as a trapezoidal shape, the length of the first side 341 of the trapezoidal-shaped air outlet 340 is longer than the length of the second side 342 of the trapezoidal-shaped air outlet 340, thus, a sector-shaped jet of the cold airflows W2 will be spouted from the trapezoidal-shaped air outlet 340.

As known in the simulation results of FIG. 3, the cold airflows W2 are quite high in flowing speed, in which a wind speed range of an air-spouted section T1 of the trapezoidal-shaped air outlet 340 is in a range of 2-5 meter/second, and a wind speed range of an air-spouted section T2 located above the heat dissipation fin module 600 is in a range of 2-4 meter/second, thus, the cold airflows W2 is high enough in speed and pressure for blocking the hot air H flowed back into the chamber 310 of the centrifugal fan module 200 via each air inlet 320, so as to enhance the heat dissipation performance of the centrifugal fan module 200 and the entire effectiveness of heat dissipation of the heat dissipation device 200. Furthermore, the trapezoidal-shaped air outlet 340 can release overpressure inside the volute-shaped frame 300 of the centrifugal fan module 200 so as to decrease noise of the centrifugal fan module 200.

Figure 4:
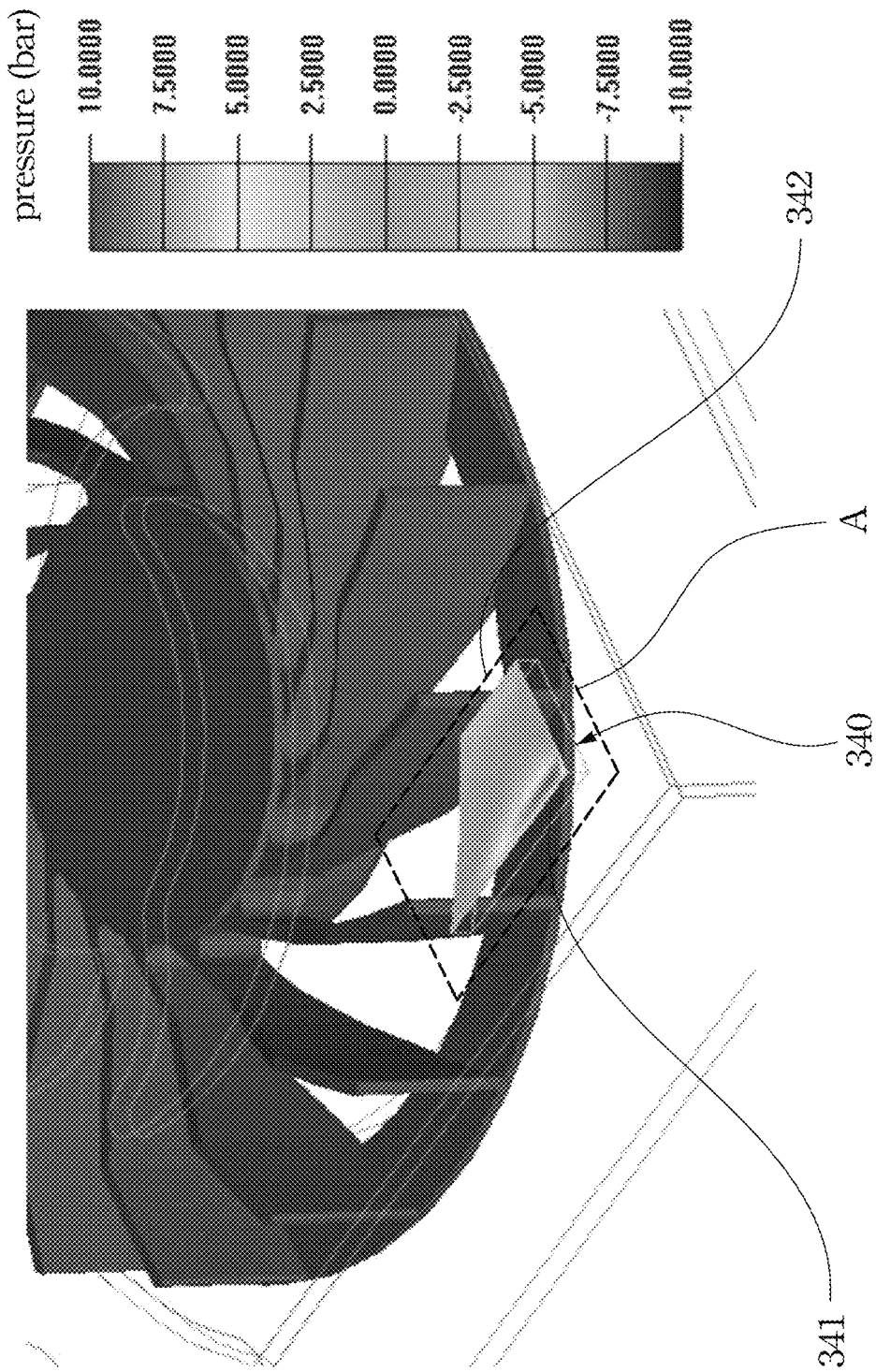
FIG. 4 is a simulation result diagram of a mixed zone with positive and negative pressure of the trapezoidal opening of the heat dissipation device of the present invention.

Referring to FIG. 4 in which FIG. 4 is a simulation result diagram of a mixed zone with positive and negative pressure of the trapezoidal-shaped opening 340 of the heat dissipation device 200 of the present invention.

As known in the simulation results of FIG. 4, while the heat dissipation device 200 is made under a simplex design and a system impedance-free condition, the trapezoidal-shaped opening 340 can be formed as a mixed zone A with positive and negative pressure, namely, the space of the trapezoidal-shaped opening 340 neighboring to the first side 341 thereof becomes under a positive pressure (i.e. air-exhausted phenomenon), and a pressure range is in a range of 0 to 10 bar; the space of the trapezoidal-shaped opening 340 neighboring to the second side 342 thereof becomes under a negative pressure (i.e. air-breathed phenomenon), and a pressure range is in a range of −5 to −2.5 bar, and no sector-shaped jet is happened here.

Figure 5:
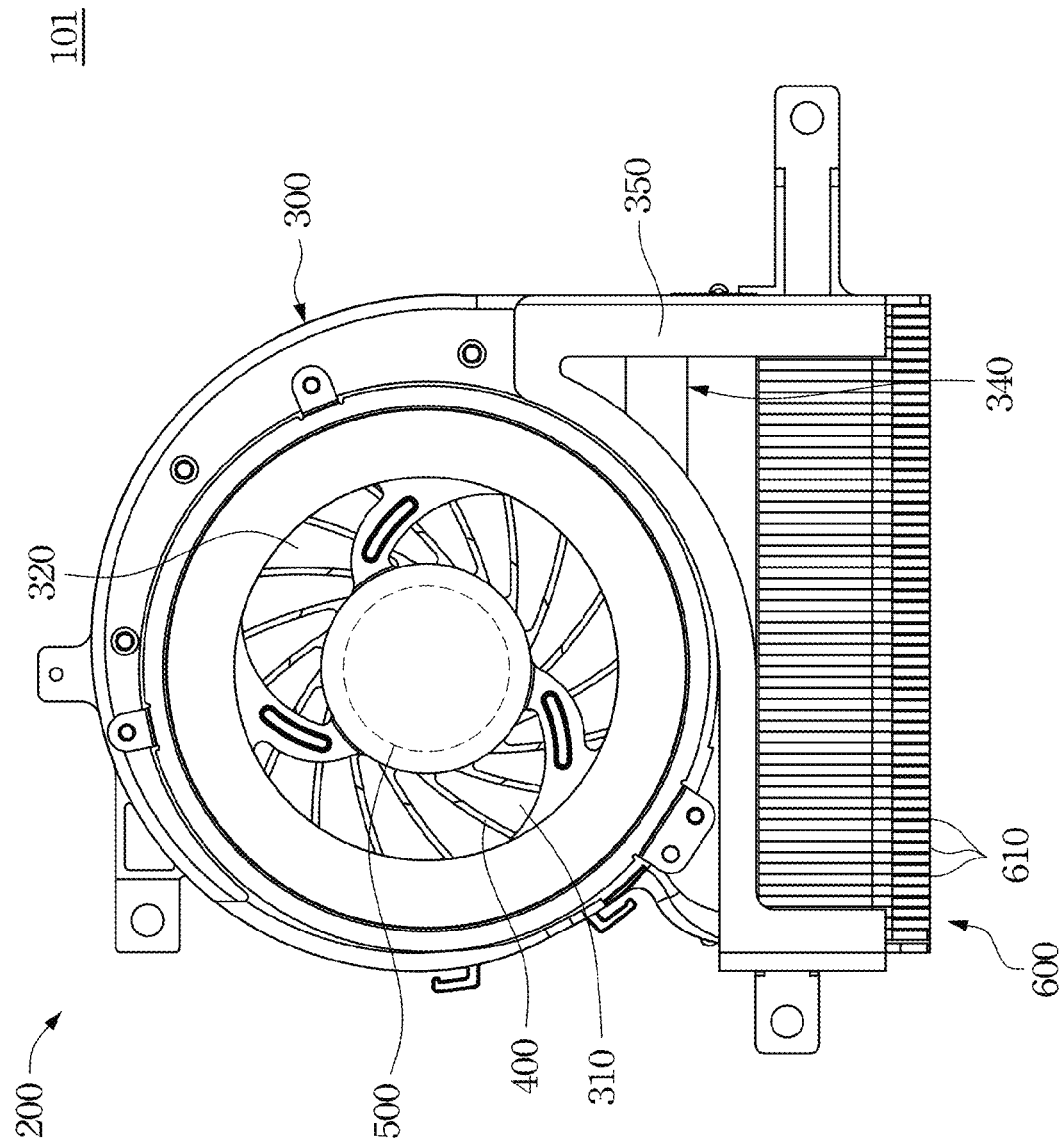
FIG. 5 is a top view of a heat dissipation device according to another embodiment of the present invention.

Referring to FIG. 5 in which FIG. 5 is a top view of a heat dissipation device 101 according to another embodiment of the present invention.

In another embodiment, the heat dissipation device 101 is further provided with wind-resisted walls 350. Each wind-resisted wall 350 is disposed on one of the opposite surfaces of the volute-shaped frame 300 having the smaller air outlet 340, and the wind-resisted wall 350 is arranged between the air inlet 320 and the smaller air outlet 340, and is arranged between the air inlet 320 and the heat dissipation fin module 600, but not arranged between the smaller air outlet 340 and the heat dissipation fin module 600. Thus, each wind-resisted wall 350 can block heat air from the heat dissipation fin module 600 to flow back into the centrifugal fan module 200 via the air inlet 320. The material of the wind-resisted wall 350 can be heat-insulating material with elastic property for insulating the heat air; also, the wind-resisted wall 350 can be used for heat insulation and cushion to a neighboring structure of the heat dissipation device 101.

When the centrifugal fan 400 is driven to rotate, since the wind-resisted wall 350 is configured on the volute-shaped frame 300, it can prevent the heat air flowing back into the volute-shaped frame 300. In other embodiments, since a distance between a heat dissipation fin module and an air inlet might be quit large, the wind-resisted wall 350 may be omitted in the embodiments.

Figure 6:
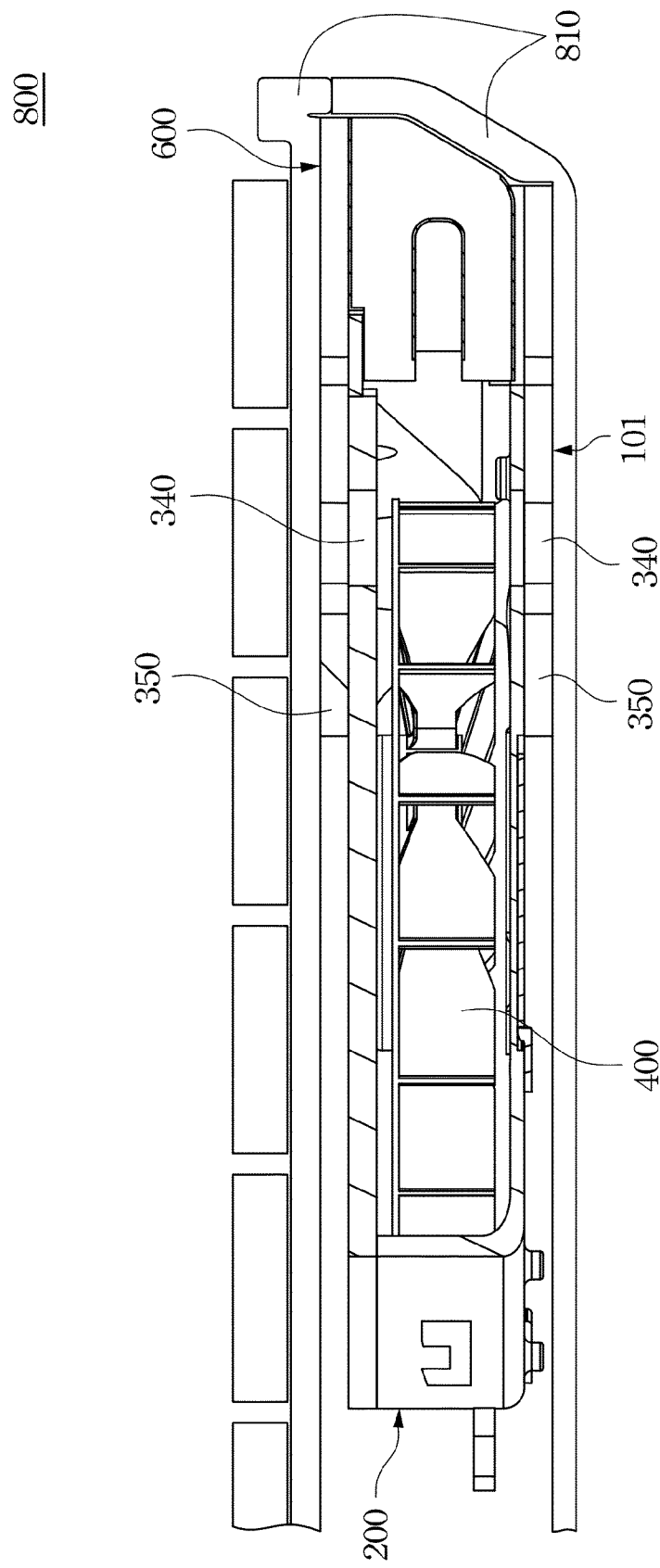
FIG. 6 is a sectional view of an electric device having the heat dissipation device therein according to the present invention.

Referring to FIG. 6 in which FIG. 6 is a sectional view of an electric device 800 having the heat dissipation device 101 therein according to the present invention.

The so called electric device 800 is not limited in a specified industry, for example, the electric device 800 can be a notebook computer or a video projector etc. By illustrating the electric device 800 to be a notebook computer as one of the examples in the embodiment of the present invention, the notebook computer comprises a chassis 810 and the aforementioned heat dissipation device 101 or 100. The heat dissipation device 101 or 100 is installed inside the chassis 810 for solving the overheat problem on the surfaces of the chassis 810 above and below the heat dissipation fins 610.

Furthermore, since the wind-resisted walls 350 which are respectively disposed on the opposite surfaces of the volute-shaped frame 300 physically contact two inner opposite surfaces of the chassis 810 above and below the heat dissipation fins 610, respectively, thus, the wind-resisted walls 350 further help to prevent air flowing back into the volute-shaped frame 300.

As known in the embodiments of the present invention, the heat dissipation device is capable of blocking heat air to flow back into the centrifugal fan module after the heat air passes through the radiating fin, so as to enhance the entire flow speed for increasing cold air so that the temperature of whole heat dissipation area can be cut down, and solve the overheat problem on the chassis surfaces neighboring the heat dissipation device. Moreover, the heat dissipation device of the present invention also can release overpressure in the centrifugal fan module so as to decrease high-frequency noise of the centrifugal fan module.

Although the present invention has been described with reference to the preferred embodiments thereof, it is apparent to those skilled in the art that a variety of modifications and changes may be made without departing from the scope of the present invention which is intended to be defined by the appended claims.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A heat dissipation device, comprising:
    a heat dissipation fin module; and
    a centrifugal fan module comprising:
        a volute-shaped frame having an air inlet, a larger air outlet and at least one smaller air outlet, the air inlet formed on a surface of the volute-shaped frame, the larger air outlet formed on a volute opening of the volute-shaped frame and being connected to the heat dissipation fin module, and the at least one smaller air outlet being formed on the surface of the volute-shaped frame closer to the heat dissipation fin module than the air inlet, wherein the at least one smaller air outlet is presented as a trapezoidal shape, and comprises a first side and a second side opposite with each other, the first side thereof is closer to the heat dissipation fin module than the second side thereof, and the first side thereof is longer than the second side thereof;
        a centrifugal fan pivotally disposed in the centrifugal fan module, rotating according to a clockwise direction, wherein the centrifugal fan inhales air through the air inlet, and blows air from the larger air outlet and the at least one smaller air outlet together, wherein the at least one smaller air outlet is allowed to spout a sector-shaped jet of the air towards the heat dissipation fin module; and
        a motor driving the centrifugal fan to rotate,
    wherein the at least one smaller air outlet is further located on the surface of the volute-shaped frame corresponding to a maximum wind-speed flowing path of the centrifugal fan to the larger air outlet.

2. The heat dissipation device according to claim 1, wherein two of the at least one smaller air outlets are symmetrically arranged on two opposite surfaces of the volute-shaped frame.

3. The heat dissipation device according to claim 1, wherein the maximum wind-speed flowing path of the centrifugal fan is an air flowing direction of the air which is perpendicular to a longitudinal side of the heat dissipation fin module, after the air is blown apart from the rotating centrifugal fan.

4. The heat dissipation device according to claim 1 further comprising:
    a wind-resisted wall disposed on the surface of the volute-shaped frame, arranged between the air inlet and the at least one smaller air outlet, and between the air inlet and the heat dissipation fin module.

5. An electric device comprising:
    a heat dissipation device according to claim 1; and
    a chassis containing the heat dissipation device.

6. The heat dissipation device according to claim 1, wherein the air from the at least one smaller air outlet is output at a velocity that is great enough to block hot air from the heat dissipation fin module from returning to the air inlet.

7. A centrifugal fan module comprising:
    a centrifugal fan; and
    a volute-shaped frame containing the centrifugal fan therein, and the volute-shaped frame comprising:
        two opposite surfaces;
        two air inlets respectively formed on the two opposite surfaces of the volute-shaped frame, for providing air inhaled into the centrifugal fan;
        a larger air outlet arranged to be a volute opening of the volute-shaped frame between the two opposite surfaces, for outputting most part of the air from the centrifugal fan; and
        two trapezoidal air outlets respectively formed on the opposite surfaces of the volute-shaped frame and corresponding to a maximum wind-speed flowing path of the centrifugal fan to the larger air outlet, for outputting a smaller part of the air from the centrifugal fan, each of the trapezoidal air outlets having two opposite sides arranged in parallel and one of the two opposite sides which is longer than the other of the two opposite sides is closer to the larger air outlet, wherein each of the trapezoidal air outlets is allowed to spout a sector-shaped jet of the smaller part of the air.

8. The centrifugal fan module according to claim 7, wherein the maximum wind-speed flowing path of the centrifugal fan is an air flowing direction of the air which is perpendicular to a longitudinal side of the larger air outlet, after the air is blown apart from the rotating centrifugal fan.

9. The centrifugal fan module according to claim 7 further comprising:
    two wind-resisted walls respectively disposed on the opposite surfaces of the volute-shaped frame, and each of the wind-resisted walls is arranged between one of the air inlets and one of the trapezoidal air outlets, and between one of the air inlets and the larger air outlet.

10. The centrifugal fan module according to claim 7, wherein the smaller part of the air from the two trapezoidal air outlets is output at a velocity that is great enough to block hot air from a heat dissipation fin module, that is connected with the larger air outlet, from returning to the two air inlets.

\* \* \* \* \*